(12) United States Patent
Sung et al.

(10) Patent No.: US 7,884,542 B2
(45) Date of Patent: Feb. 8, 2011

(54) ORGANIC DISPLAY DEVICE WITH WALL INCLUDING AN OPENING AND A CONTACT HOLE

(75) Inventors: Un-cheol Sung, Anyang-si (KR); Jin-koo Chung, Suwon-si (KR); Jung-soo Rhee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 610 days.

(21) Appl. No.: 11/843,210

(22) Filed: Aug. 22, 2007

(65) Prior Publication Data
US 2008/0150434 A1 Jun. 26, 2008

(30) Foreign Application Priority Data
Dec. 26, 2006 (KR) .................. 10-2006-0134186

(51) Int. Cl.
H01J 1/62 (2006.01)
H01J 63/04 (2006.01)
(52) U.S. Cl. ........................... 313/506; 313/504
(58) Field of Classification Search .................. 313/498, 313/500, 504, 506, 509, 512; 428/690, 917; 345/76; 445/24
See application file for complete search history.

(56) References Cited

U.S. PATENT DOCUMENTS

| | | | |
|---|---|---|---|
| 5,640,067 A * | 6/1997 | Yamauchi et al. ........... 313/506 |
| 6,977,463 B2 * | 12/2005 | Sato ........................... 313/498 |
| 7,095,046 B2 * | 8/2006 | Ishikawa ...................... 257/59 |
| 7,518,140 B2 * | 4/2009 | Suh et al. ...................... 257/40 |
| 2002/0140643 A1 * | 10/2002 | Sato ............................ 345/76 |
| 2003/0057862 A1 * | 3/2003 | Segawa .................. 315/169.3 |
| 2003/0062523 A1 * | 4/2003 | Bae et al. ...................... 257/72 |
| 2005/0007322 A1 * | 1/2005 | Adachi et al. ................. 345/82 |
| 2005/0145861 A1 * | 7/2005 | Kawakami et al. ............ 257/88 |
| 2005/0179372 A1 * | 8/2005 | Kawakami et al. .......... 313/506 |
| 2006/0033862 A1 * | 2/2006 | Huang et al. ................ 349/110 |
| 2006/0214564 A1 * | 9/2006 | Chang ........................ 313/504 |
| 2007/0085116 A1 * | 4/2007 | Lee et al. .................... 257/291 |

FOREIGN PATENT DOCUMENTS

| JP | 2005258160 | 9/2005 |
|---|---|---|
| KR | 1020050115775 | 12/2005 |
| KR | 1020060028251 | 3/2006 |

* cited by examiner

*Primary Examiner*—Nimeshkumar D Patel
*Assistant Examiner*—Glenn Zimmerman
(74) *Attorney, Agent, or Firm*—Cantor Colburn LLP

(57) ABSTRACT

A display device includes; an insulating substrate, a thin film transistor disposed on the insulating substrate and which comprises a drain electrode, a wall disposed on the thin film transistor and which includes an opening and a contact hole which exposes the drain electrode, a pixel electrode connected to the drain electrode through the contact hole and which comprises a first part in direct contact with the insulating substrate and a second part connected to the first part, an organic layer disposed on the pixel electrode and which comprises an organic emission layer, and a common electrode disposed on the organic layer.

10 Claims, 20 Drawing Sheets

ORGANIC DISPLAY DEVICE WITH WALL INCLUDING AN OPENING AND A CONTACT HOLE

This application claims priority to Korean Patent Application No. 2006-0134186, filed on Dec. 26, 2006, and all the benefits accruing therefrom under 35 U.S.C. §119, the contents of which in its entirety are herein incorporated by reference.

BACKGROUND OF THE INVENTION (a) Field of the Invention

The present invention relates to a display device and a method of manufacturing the same, and more particularly, to a bottom emission type display device which emits light from an organic layer to an insulating substrate, and a method of manufacturing the same.

(b) Description of the Related Art

Organic light emitting diode ("OLED") displays have recently attracted attention among the wide variety of flat panel displays because they are driven with a low voltage; are thin and lightweight; have a wide view angle; have a relatively short response time; and various other advantageous features.

OLED displays may be categorized as bottom emission type or top emission type displays according to the direction in which the displays emit light generated from an emission layer to the outside.

In the case of the bottom emission type OLED display, the light generated from the emission layer is emitted to the outside via an insulating substrate. In such a display an insulating layer and/or an organic layer are interposed between the emission layer and the insulating substrate.

However, not all of the light generated from the emission layer is passed to the outside; some light is absorbed by the insulating layer and the organic layer. This lowers the light emitting efficiency of the display. Furthermore, color coordinates of the light generated from the emission layer are distorted while passing through the insulating layer and the organic layer.

BRIEF SUMMARY OF THE INVENTION

Accordingly, it is an aspect of the present invention to provide an exemplary embodiment of a display device having improved light emitting efficiency.

Another aspect of the present invention is to provide an exemplary embodiment of a method of manufacturing an exemplary embodiment of a display device having improved light emitting efficiency.

Additional aspects, features and/or advantages of the present invention will be set forth in part in the description which follows and, in part, will be obvious from the description, or may be learned by practice of the present invention.

An exemplary embodiment of a display device includes; an insulating substrate, a thin film transistor disposed on the insulating substrate and which comprises a drain electrode, a wall disposed on the thin film transistor which includes an opening and a contact hole which exposes the drain electrode, a pixel electrode connected to the drain electrode through the contact hole which comprises a first part in direct contact with the insulating substrate and a second part connected to the first part, an organic layer disposed on the pixel electrode and which comprises an organic emission layer, and a common electrode disposed on the organic layer.

According to an exemplary embodiment of the present invention, the thin film transistor further comprises an ohmic contact layer disposed below the drain electrode, and the drain electrode and the ohmic contact layer have substantially the same surface area and are disposed above substantially the same region of the insulating substrate.

According to an exemplary embodiment of the present invention, an edge of the opening is disposed above the first part of the pixel electrode.

According to an exemplary embodiment of the present invention, an edge of the opening is in direct contact with the insulating substrate.

According to an exemplary embodiment of the present invention, the display device further comprises an insulating layer disposed between the insulating substrate and the wall, wherein the wall and the insulating layer are in direct contact with each other.

According to an exemplary embodiment of the present invention, the thin film transistor further comprises a gate electrode, and the insulating layer is disposed between the gate electrode and the drain electrode.

According to an exemplary embodiment of the present invention, at least a portion of the first part of the pixel electrode is disposed between the insulating substrate and the insulating layer.

According to an exemplary embodiment of the present invention, at least a portion of the first part of the pixel electrode is disposed between the insulating substrate and the wall.

According to an exemplary embodiment of the present invention, the gate electrode comprises a lower transparent layer and an upper metal layer.

According to an exemplary embodiment of the present invention, the pixel electrode disposed between the insulating substrate and the wall has a lower resistance than the pixel electrode connected to the drain electrode.

According to an exemplary embodiment of the present invention, the common electrode comprises a reflective metal layer.

An exemplary embodiment of a method of manufacturing a display device, includes; disposing a thin film transistor including a drain electrode on an insulating substrate, disposing a wall on the thin film transistor, the wall comprising an opening and a contact hole which exposes the drain electrode, connecting a pixel electrode to the drain electrode through the contact hole wherein the pixel electrode comprises a first part in direct contact with the insulating substrate and a second part connected to the first part, disposing an organic layer on the first electrode, the organic layer comprising an organic emission layer, and disposing a second electrode on the organic layer.

According to an exemplary embodiment of the present invention, the disposing the thin film transistor on an insulating substrate includes; disposing a gate electrode on the insulating substrate, disposing an insulating layer on the gate electrode and substantially the entire insulating substrate except a region corresponding to at least a portion of the first part of the pixel electrode, and disposing a semiconductor layer, an ohmic contact layer, a source electrode and the drain electrode on the insulating layer corresponding to the gate electrode.

According to an exemplary embodiment of the present invention, the wall is disposed directly contacting the source electrode and the drain electrode.

According to an exemplary embodiment of the present invention, disposing the semiconductor layer, the ohmic contact layer, the source electrode and the drain electrode on the insulating layer includes using a single photolithographic mask.

According to an exemplary embodiment of the present invention, the connecting of the pixel electrode to the drain electrode is performed using a shadow mask having an opening corresponding to the pixel electrode.

Another exemplary embodiment of a method of manufacturing an exemplary embodiment of a display device includes; disposing a transparent conductive layer and a metal layer on an insulating substrate, patterning the transparent conductive layer and the metal layer to form a first pixel electrode which comprises the transparent conductive layer and is in direct contact with the insulating substrate, and a gate electrode including the metal layer and the transparent conductive layer, disposing an insulating layer on the insulating substrate, the gate electrode, and at least a portion of the first pixel electrode, disposing a semiconductor layer, an ohmic contact layer, a source electrode and a drain electrode on the insulating layer corresponding to the gate electrode, disposing a wall on a thin film transistor which includes the semiconductor layer, ohmic contact layer, source electrode and drain electrode, the wall including an opening which at least partially exposes the first pixel electrode and a contact hole which exposes the drain electrode, connecting a second pixel electrode to the drain electrode via the contact hole, connecting the second pixel electrode to the first pixel electrode, disposing an organic layer including an organic emission layer on the second pixel electrode, and disposing a common electrode on the organic layer.

According to an exemplary embodiment of the present invention, the disposing of the wall on the thin film transistor includes disposing the wall in direct contact with the source electrode and the drain electrode.

According to an exemplary embodiment of the present invention, disposing the semiconductor layer, the ohmic contact layer, the source electrode and the drain electrode on the insulating layer includes using a single photolithographic mask.

According to an exemplary embodiment of the present invention, the forming of the first pixel electrode includes using a shadow mask having an opening corresponding to the first electrode.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which.

DETAILED DESCRIPTION OF THE INVENTION

Figure 1:
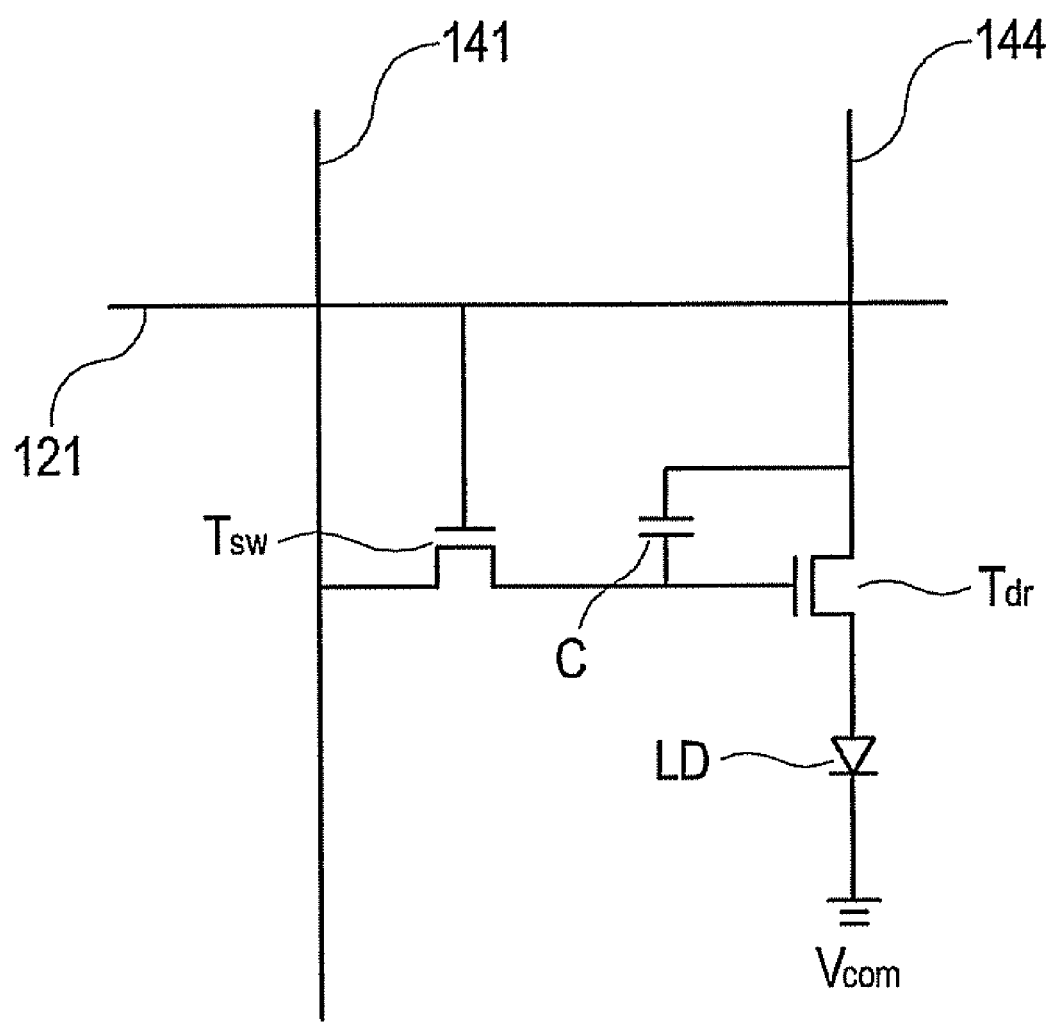
FIG. 1 is an equivalent circuit diagram of a first exemplary embodiment of a display device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIG. 1 is an equivalent circuit diagram of a first exemplary embodiment of a display device according to the present invention.

The first exemplary embodiment of a display device includes a plurality of pixels. One pixel of the first exemplary embodiment of a display device is provided with a plurality of signal lines. The signal lines include a gate line 121 to transmit a scan signal, a data line 141 to transmit a data signal, and a driving voltage line 144 to transmit a driving voltage. In the present exemplary embodiment, the data line 141 and the driving voltage line 144 are substantially adjacent to and parallel with each other and the gate line 121 extends substantially perpendicularly to the data line 141 and the driving voltage line 144.

Each pixel includes an organic light emitting device LD, a switching thin film transistor Tsw, a driving thin film transistor Tdr, and a capacitor C.

The switching thin film transistor Tsw has a control terminal (gate electrode) connected to the gate line 121, an input terminal (source electrode) connected to the data line 141, and an output terminal (drain electrode) connected to the control terminal of the driving thin film transistor Tdr. The switching thin film transistor Tsw transmits the data signal from the data line 141 to the driving thin film transistor Tdr in response to the scan signal applied to the gate line 121.

The driving thin film transistor Tdr has a control terminal (gate electrode) connected to the switching thin film transistor Tsw, an input terminal (source electrode) connected to the driving voltage line, and an output terminal (drain electrode) connected to the organic light emitting device LD.

The capacitor C is connected between the control terminal and the input terminal of the driving thin film transistor Tdr. The capacitor C stores and maintains the data signal to be input to the control terminal of the driving thin film transistor Tdr.

The organic light emitting device LD has an anode connected to the output terminal of the driving thin film transistor Tdr, and a cathode to which a common voltage is applied. The organic light emitting device LD emits light with a brightness varying according to the intensity of a current output from the driving thin film transistor Tdr. The first exemplary embodiment of a display device may thereby combine the lights emitted from the plurality of pixels to display an image. The intensity of the current output from the driving thin film transistor Tdr varies according to voltages applied between the control terminal and the output terminal of the driving thin film transistor Tdr.

Below, the first exemplary embodiment of a display device according to the present invention will be described in more detail with reference to FIG. 2.

Figure 2:
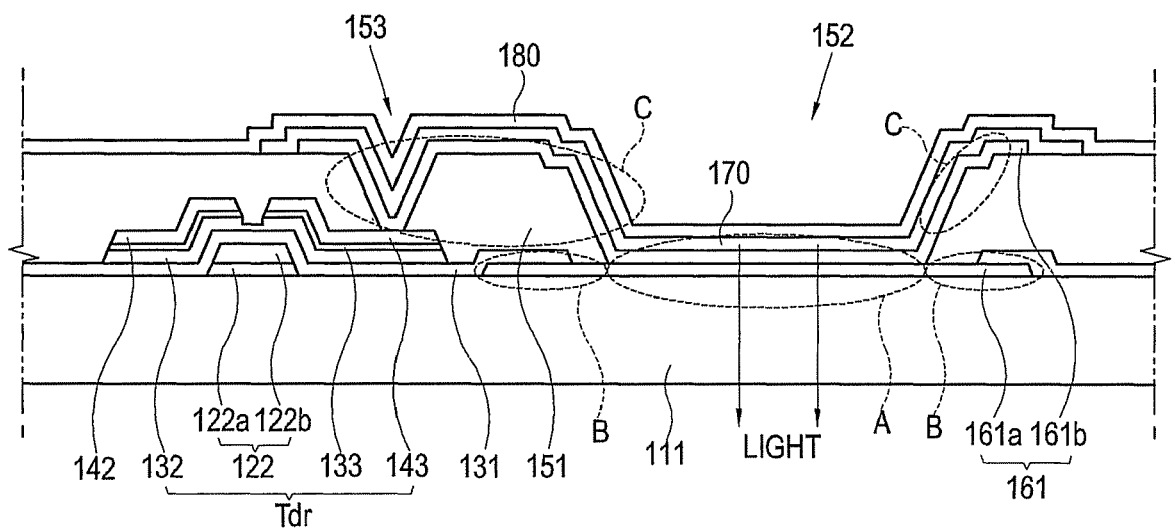
FIG. 2 is a cross-sectional view of the first exemplary embodiment of a display device according to the present invention.

In FIG. 2, the switching transistor Tsw is not shown, however, exemplary embodiments include configurations wherein it may have a similar structure to the driving transistor Tdr.

The driving transistor Tdr includes a gate electrode 122 and a first pixel electrode 161a is formed on an insulating substrate 111. The first pixel electrode 161a and a second pixel electrode 161b form a pixel electrode 161.

The gate electrode 122 includes a lower layer 122a and an upper layer 122b. The lower layer 122a includes a transparent conductive material, exemplary embodiments of which include indium tin oxide ("ITO"), indium zinc oxide ("IZO"), and other similar materials, and the upper layer 122b includes a metal.

In the present exemplary embodiment the first pixel electrode 161a is in direct contact with the insulating substrate 111, and includes substantially the same material as the lower layer 122a of the gate electrode 122.

An insulating layer 131 is formed on the gate electrode 122. The insulating layer 131 includes an inorganic material, exemplary embodiments of which include silicon nitride and other similar materials. The insulating layer 131 exposes and partially overlaps the first pixel electrode 161a.

A semiconductor layer 132 is formed on the insulating layer 131 above the gate electrode 122, and an ohmic contact layer 133 is formed on the semiconductor layer 132.

The ohmic contact layer 133 is divided into two parts with respect to the gate electrode 122. In one exemplary embodiment the ohmic contact layer 133 is made of n+ silicon or other similar materials.

In one exemplary embodiment the semiconductor layer 132 and the ohmic contact layer 133 may be made of amorphous silicon, microcrystalline silicon, crystalline silicon (poly silicon) or other similar materials.

A source electrode 142 and a drain electrode 143 are formed on the ohmic contact layer 133. The source electrode 142 and the drain electrode 132 are separated from each other across a channel region disposed therebetween.

In the first exemplary embodiment, the source electrode 142 and the drain electrode 143 overlap the ohmic contact layer 133. The source electrode 142 and the drain electrode 142 substantially overlap the semiconductor layer 132 except across the channel region.

A wall 151 is formed on the driving thin film transistor Tdr. In the present exemplary embodiment the wall 151 is in direct contact with the source electrode 142, the drain electrode 143, and the insulating layer 131. In the present exemplary embodiment an additional planarization layer is not used as the pixel electrode 161 is formed on the already planarized insulating substrate 111.

The wall 151 is formed with an opening 152 to expose the first pixel electrode 161a, and a contact hole 153 to expose the drain electrode 143. An edge of the opening 152 is in direct contact with the first pixel electrode 161a.

The second pixel electrode 161b is formed on the wall 151 and the first pixel electrode 161a. The second pixel electrode 161b is connected with the drain electrode 143 via the contact hole 153 and extends substantially above the first pixel electrode 161a.

In one exemplary embodiment the second pixel electrode 161b may include indium tin oxide ("ITO") or indium zinc oxide ("IZO") or other similar materials. In the present exemplary embodiment the first pixel electrode 161a is formed to have a lower electrical resistance than the second pixel electrode 161b for reasons described below.

The pixel electrode 161 has a two-layered structure with the first pixel electrode 161a disposed on the bottom and the second pixel electrode 161b disposed on top. The pixel electrode 161 is further divided into a first part, which directly contacts the insulating substrate 111, and a second part, which does not directly contact the insulating substrate 111.

The first part corresponds to the "A" and "B" regions of the pixel electrode 161 as shown in FIG. 2. The region "B" is disposed on at least two sides of the region "A". The first pixel electrode 161a is disposed substantially within the first part. Also, the second pixel electrode 161b formed in the opening 152 is disposed substantially within the first part. The pixel electrode 161 in the "A" region is left uncovered by the wall 151 by the opening 152, and the first pixel electrode 161a is covered by the wall 151 or the insulating layer 131 or both in the region "B".

The second part corresponds to a "C" region of the pixel electrode 161 as shown in FIG. 2. The region "C" is disposed on at least two sides of the region "A". The second pixel electrode 161b, which is disposed on the wall 151 and does not directly contact the insulating substrate 111, is disposed substantially within the second part.

An organic layer 170 is formed on the pixel electrode 161 and the wall 151. In the present exemplary embodiment the organic layer 170 includes an organic emission layer. In alternative exemplary embodiments the organic layer may further include an electron injection layer, an electron transport layer, a hole injection layer, a hole transport layer, or various combinations thereof.

When included, the hole injection layer and the hole transport layer include strong fluorescent amine derivatives. Exemplary embodiments of the fluorescent amine derivatives include triphenyldiamine derivatives, styryl amine derivatives, amine derivatives having an aromatic condensed ring, and various other similar materials.

When included, one exemplary embodiment of the electron transport layer includes quinoline derivatives. Exemplary embodiments of the electron transport layer may include aluminum tris(8-hydroxyquinoline)(Alq3) as a quinoline derivative. Alternative exemplary embodiments include configurations wherein the electron transport layer includes phenyl anthracene derivatives or tetraarylethen derivatives.

In one exemplary embodiment the electron injection layer may include barium (Ba) or calcium (Ca).

In one exemplary embodiment the organic emission layer emits light corresponding to one of a red color, a green color, a blue color and white color. In one such exemplary embodiment neighboring organic emission layers emit light of different colors from each other.

In an alternative exemplary embodiment the organic emission layer may emit light of the white color. In such an alternative exemplary embodiment a color filter may be provided between the organic layer 170 and an outside.

The organic layer 170 substantially covers the pixel electrode 161 and prevents short-circuits between the pixel electrode 161 and a common electrode 180.

The common electrode 180 is formed on the organic layer 170 and the wall 151. In one exemplary embodiment the common electrode 180 includes a reflective metal layer.

A description of the emission of light from the organic layer 170 follows.

Holes are introduced from the pixel electrode 161 and electrons are introduced from the common electrode 180. The holes and electrons recombine to form excitons within the organic layer 170, and photons, which may be perceived by an observer as visible light, are emitted when the excitons de-excite. Alternative exemplary embodiments include configurations wherein holes are introduced from the common electrode 180 and electrons are introduced from the pixel electrode 161.

In the current exemplary embodiment the light emitted from the organic layer 170 toward the common electrode 180 is reflected toward the pixel electrode 161. The pixel electrode 161 is substantially transparent, so that the light from the organic layer 170 is transmitted to the outside through the pixel electrode 161 and the insulating substrate 111. This is commonly referred to as a bottom-type display.

In the current exemplary embodiment the light which is emitted to the outside is generated primarily from the "A" region, and that light is not transported through the insulating layer 131. Therefore, there is no loss of light due to photons passing through the insulating layer 131, thereby light emitting efficiency is improved. Also, color coordinates of the emitted light are not distorted by passing through the insulating layer 131.

Below, an exemplary embodiment of a method of manufacturing the first exemplary embodiment of a display device according to the present invention will be described with reference to FIGS. 3A through 3N. In the present exemplary embodiment the semiconductor layer 132 and the ohmic contact layer 133 are made of crystalline silicon, and the organic layer 170 is formed by a dry method such as thermal evaporation. Alternative exemplary embodiments include configurations wherein the organic layer 170 may be formed through a wet method such as ink jet printing.

Figure 3A:
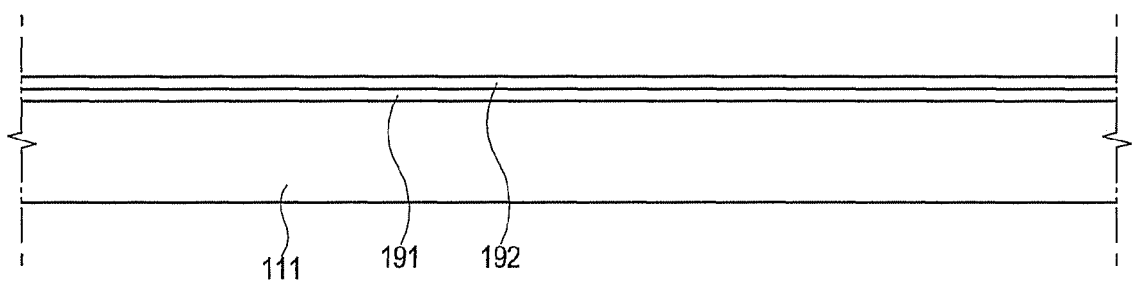
FIGS. 3A through 3N illustrate an exemplary embodiment of a method of manufacturing the first exemplary embodiment of a display device according to the present invention.

First, referring to FIG. 3A, a transparent conductive layer 191 and a metal layer 192 are formed on the insulating substrate 111. In the present exemplary embodiment the transparent conductive layer 191 and the metal layer 192 are formed by a sputtering method; however, alternative exemplary embodiments include configurations wherein the transparent conductive layer 191 and the metal layer 192 are formed by other methods such as chemical vapor deposition ("CVD") and other similar methods. Because the transparent conductive layer 191 is formed on the insulating substrate 111 and the metal layer 192 are formed first, before other more temperature sensitive elements, the transparent conductive layer 191 can be formed at a high temperature resulting in a good quality (e.g., low resistance). The transparent conductive layer 191 may be formed with a very low resistance because at this stage in the manufacturing process no other layers will be harmed by the high temperatures required to generate a low resistance conductive layer. This transparent conductive layer 191 will eventually form the first pixel electrode 161a. As will be described in more detail below, the second pixel electrode 161b will be formed after more temperature sensitive components have already been formed, and therefore it will not be able to be heated to the same degree, and therefore attain the same low level of resistivity, as the first pixel electrode 161a.

Figure 3B:
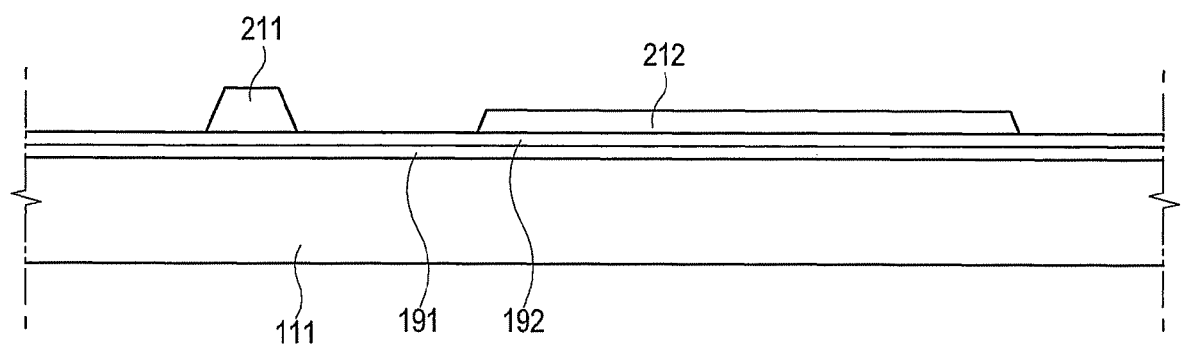

Then, a photoresist layer pattern 211, 212 is formed as shown in FIG. 3B. A first photoresist layer pattern 211 corresponds to a position where the gate electrode 122 is to be formed, and a second photoresist layer pattern 212 corresponds to a position where the first pixel electrode 161a is to be formed. The first photoresist layer pattern 211 is formed to be thicker than the second photoresist layer pattern 212 for reasons described in more detail below.

The photoresist layer pattern 211, 212 is formed by forming a photoresist layer on the metal layer 192 and then exposing and developing the photoresist layer. Exemplary embodiments of the process for forming the photoresist layer include slit coating, spin coating, screen printing, and other similar processes.

There are various methods of making the photoresist layer pattern 211, 212 have varying thicknesses according to position. Exemplary embodiments of the various methods include using a mask having a slit, a lattice pattern or a translucent layer to adjust transmissivity with respect to a developing light above the photoresist layer so that a region of the photoresist layer corresponding to the second photoresist layer pattern 212 receives more exposure to the light than the region corresponding to the first photoresist layer pattern 211, but less exposure than the rest of the photoresist layer which is substantially removed by the developing process. The areas which are fully exposed to the developing light are then removed through a developing process, the areas which are only partially exposed to the developing light are partially removed by the developing process, and the areas which are not exposed to the developing light are not removed by the developing process.

In the exemplary embodiment wherein a mask with a slit or lattice pattern is used to form the first and second photoresist layer patterns 211 and 212, a line width of the pattern between the slits or a gap between the patterns, e.g., the width of the slit, is smaller than the resolving power of the exposure system. In other words, the line width of the pattern between the slits or a gap between the patterns allows only a portion of the developing light used in the developing process therethrough resulting in a partial exposure and development. In the exemplary embodiment wherein a mask with a translucent layer is used to form the first and second photoresist layer patterns 211 and 212, a thin film having different transmissivity or different thickness is used to adjust the transmissivity above the various regions.

When the photoresist layer is exposed to the light through the mask, a polymer which is directly exposed to the light is completely decomposed, but a polymer corresponding to a slit pattern or a translucent layer is only partially decomposed. Furthermore, the polymer which is substantially covered with a shield layer is not decomposed. When the photoresist layer is developed, only the part where polymers are not decomposed remains, and the thickness of a photoresist layer which was partially exposed to light is less than that of a part which was exposed to no light. When using an exemplary embodiment of a developing mask as described above all polymers may become decomposed if the exposure time exceeds a certain amount. Therefore, the exposure time should be adjusted to take this into consideration.

Figure 3C:
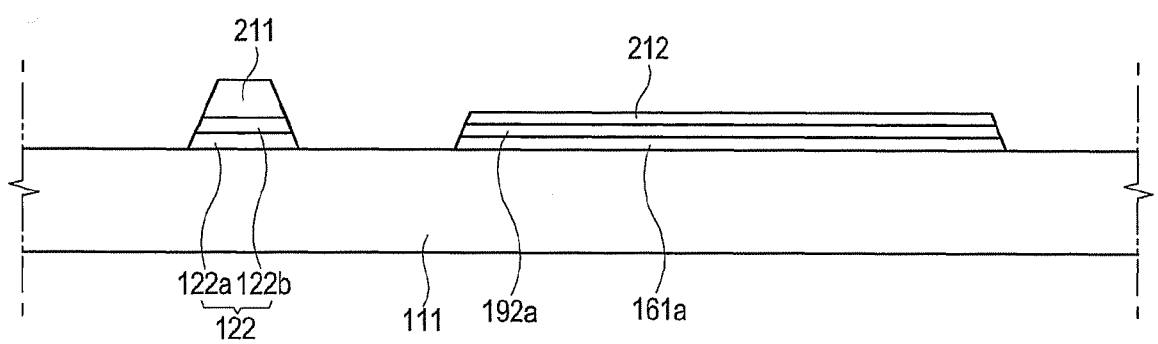

Next, as shown in FIG. 3C, the metal layer 192 and the transparent conductive layer 191, which are not covered with the photoresist layer pattern 211 and 212, are etched and removed using the first and second photoresist layer patterns 211, 212 as a mask. In this stage, the thickness of the photoresist pattern 211 and 212 is decreased due to the etching process.

Thus, the gate electrode 122 and the first pixel electrode 161a are formed. Here, a patterned metal layer 192a remains on the first pixel electrode 161a.

Figure 3D:
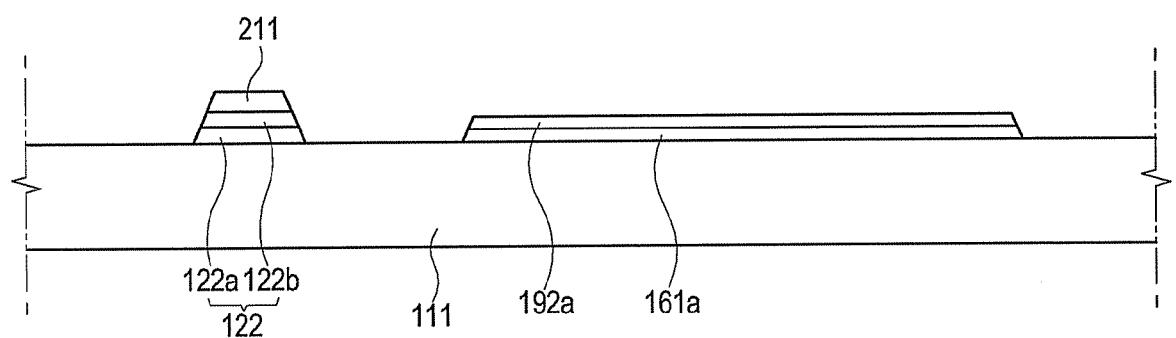

Then, as shown in FIG. 3D, the photoresist layer patterns 211 and 212 undergo ashing, and the second photoresist pattern 212 is removed to thereby expose the patterned metal layer 192a. In this stage, the thickness of the first photoresist layer pattern 211 is decreased by the ashing by at leas the thickness of the second photoresist layer 212. The ashing is performed carefully in order to not remove the first photoresist layer pattern 211.

Figure 3E:
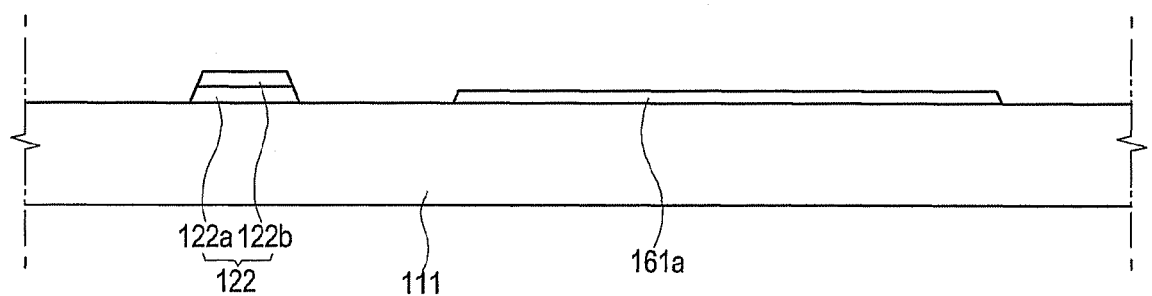

FIG. 3E illustrates that the exposed patterned-metal layer 192a and the remaining first photoresist layer pattern 211 are removed. The removal may be done by any of several well known methods including ashing.

Figure 3F:
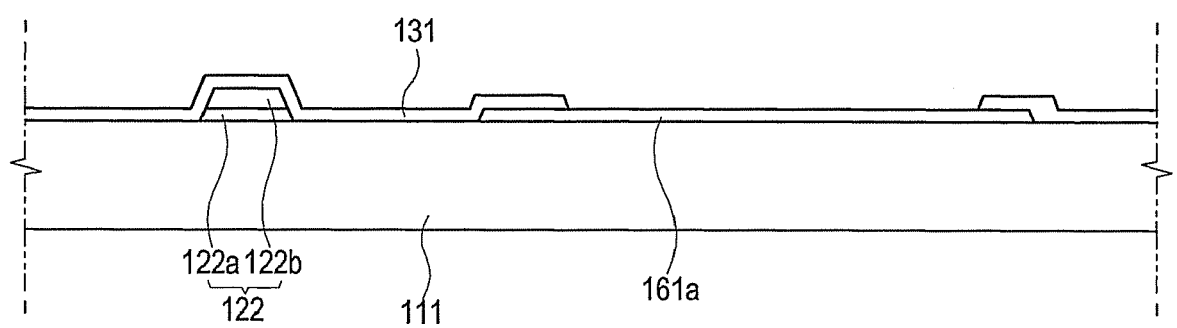

Then, as shown in FIG. 3F, the insulating layer 131 is formed on the gate electrode 122 and at least partially on the first pixel electrode 161a. Here, an insulating material layer, exemplary embodiments of which include silicon nitride, is formed on substantially the entire surface of the insulating substrate 111, and then the insulating material layer is photolithographed, thereby forming the insulating layer 131 as seen in FIG. 3F. In one exemplary embodiment the insulating material can be formed by CVD.

The insulating layer 131 surrounds the first pixel electrode 161a but leaves a relatively large part of the first pixel electrode 161a uncovered.

Figure 3G:
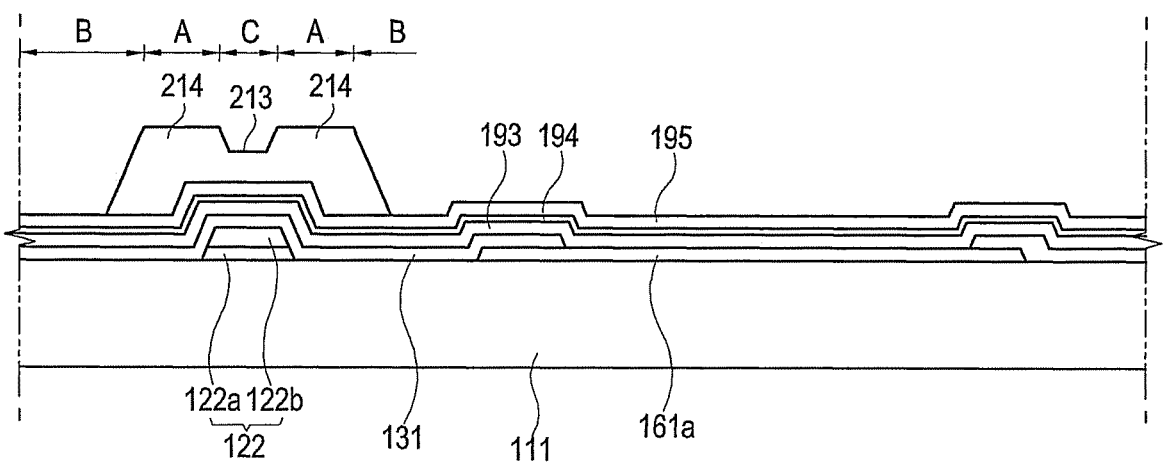

Then, as shown in FIG. 3G, a semiconductor material layer 193, an ohmic contact material layer 194, a metal layer 195 are formed in sequence. Then, a third photoresist layer pattern 213 and a fourth photoresist layer pattern 214 are formed on the metal layer 195.

In the present exemplary embodiment the semiconductor material layer 193 and the ohmic contact material layer 194 are made of crystalline silicon.

In the present exemplary embodiment the semiconductor material layer 193 and the ohmic contact material layer 194 may be formed by crystallizing an amorphous silicon layer (not shown). Exemplary embodiments of the crystallizing method include a solid phase crystallization ("SPC") method, a laser crystallization method, a rapid thermal annealing ("RTA") method, and various other similar methods.

Solid phase crystallization ("SPC") is a method of annealing the amorphous silicon for a long time at a low temperature, e.g., lower than 600° F., thereby obtaining crystalline silicon with a large grain size. Laser crystallization includes methods such as excimer laser annealing ("ELA"), sequential lateral solidification ("SLS"), and various other similar techniques, which use a laser for obtaining the crystalline silicon. Rapid thermal annealing ("RTA") is a method which deposits amorphous silicon at a low temperature and than anneals the surface of the amorphous silicon rapidly with light.

The third photoresist layer pattern 213 is placed on an area which will become the channel part C of a thin film transistor, e.g., between the source electrode 142 and the drain electrode 143. The fourth photoresist layer pattern 214 is placed on an area corresponding to the source electrode 142 and the drain electrode 143 of the yet to be formed thin film transistor. In the present exemplary embodiment the third photoresist pattern 213 is thinner than the fourth photoresist pattern 214.

A thickness ratio between the photoresist layer patterns 213 and 214 is varied according to conditions in an etching process (to be described later). In one exemplary embodiment the thickness of the third photoresist layer pattern 213 is less than half a thickness of the fourth photoresist layer pattern 214. For example, the third photoresist layer pattern has a thickness of 4,000 Å or less.

The different photoresist layer patterns 213 and 214 can be formed by substantially the same method as that shown in FIG. 3B, and repetitive descriptions thereof will be omitted.

Figure 3H:
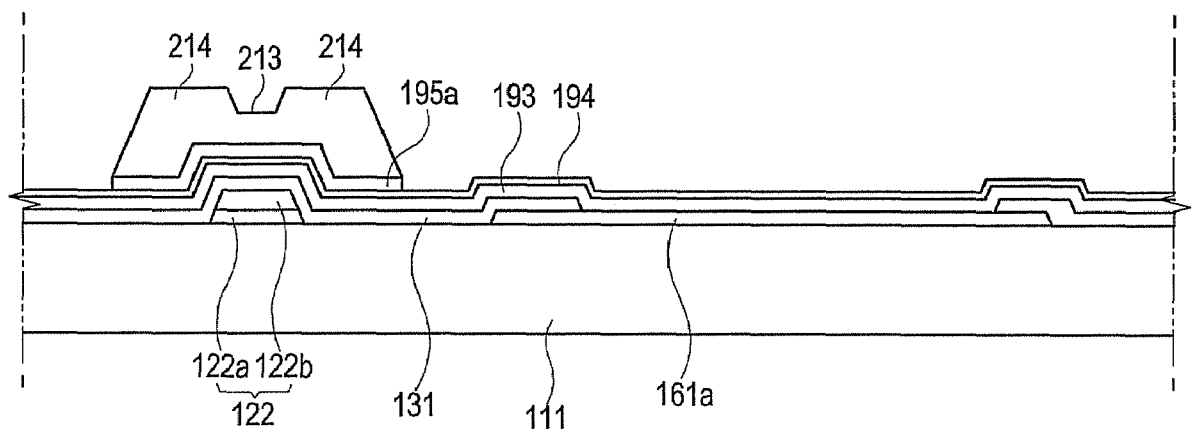

Then, the semiconductor material layer 193, the ohmic contact material layer 194 and the metal layer 195 are etched using the photoresist layer patterns 213 and 214 as a mask. Referring to FIG. 3H, the metal layer 195 not covered by the photoresist layer patterns 213 and 214 is removed, thereby exposing the ohmic contact material layer 194. At this point in the exemplary embodiment of a method of manufacturing the first exemplary embodiment of a display device dry etching and wet etching may be used.

In one exemplary embodiment the etching is performed under the condition that the metal layer 195 is etched but the photoresist layer pattern 213, 214 are not decreased in thickness by the etching. However, in the exemplary embodiment wherein dry etching is used it is difficult to control the etching process so that only the metal layer 195 is etched without etching the photoresist layer patterns 213, 214. Therefore in the exemplary embodiment using dry etching the photoresist layer pattern 213, 214 are etched together with the metal layer 195.

Accordingly, in the exemplary embodiment using dry etching, the third photoresist layer pattern 213 is formed to be substantially thicker than the third photoresist layer pattern 213 in exemplary embodiment using wet etching, thereby preventing the third photoresist layer pattern 213 from being removed and the metal layer 195 below from being exposed.

In the present exemplary embodiment the patterned metal layer 195a is not yet divided into the source electrode 142 and the drain electrode 143.

Figure 3I:
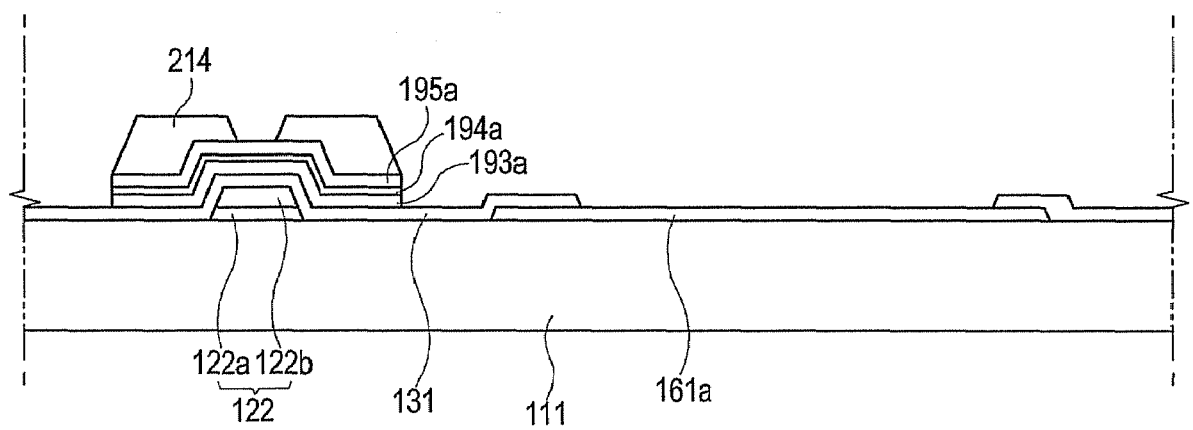

As shown in FIG. 3I, the exposed ohmic contact material layer 194 and the semiconductor material layer 193 are removed with the third photoresist layer pattern 213 by the dry etching.

In the present exemplary embodiment the dry etching is performed so that the photoresist layer patterns 213, 214, the ohmic contact material layer 194, and the semiconductor material layer 193 are removed at substantially the same time, while leaving the insulating layer 131 substantially untouched by the etching. In one exemplary embodiment an etching rate of the photoresist layer pattern 213, 214 is substantially equal to that of the semiconductor material layer 193.

Referring to FIG. 3I, the third part 213 is removed to expose the patterned metal layer 195a above the channel area of the yet to be formed thin film transistor, and a patterned ohmic contact material layer 194a and a patterned semiconductor material layer 193a are provided in substantially the same area as the patterned metal layer 195a.

In this stage in the exemplary embodiment of a method of manufacturing the first exemplary embodiment of a display device the patterned ohmic contact material layer 194a is not yet divided into two parts. Furthermore, in this stage, the thickness of the fourth photoresist layer pattern 214 is decreased due to the etching. Also in this stage any photoresist layer waste remaining on the metal layer 195a exposed in the channel area is removed. In one exemplary embodiment it may be removed by ashing.

Figure 3J:
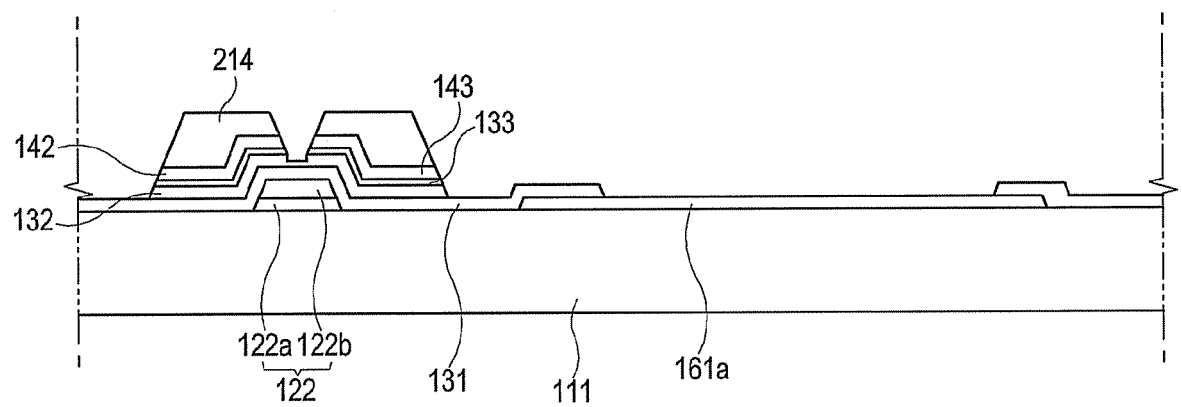

Referring to FIG. 3J, the patterned metal layer 195a in the channel area, and the patterned ohmic contact material layer 194a disposed below are etched and removed.

The etching removes the metal layer 195 and the ohmic contact material layer 194 and leaves the semiconductor material layer 193 on the area which was covered by the third photoresist layer pattern 213. The etching leaves the semiconductor material layer 193, the ohmic contact material layer 194 and the metal layer 195 on the area covered by the fourth photoresist layer pattern 214.

Because the patterned ohmic contact material layer 194a is relatively thin, it may be relatively difficult to stop the etching process so that it finishes precisely when all of the ohmic contact material layer 194a is removed. Therefore, it is possible that a portion of the patterned semiconductor layer 193a is partially removed as shown in FIG. 3J. Therefore, the thickness of the semiconductor layer 132 may be decreased, and the thickness of the third photoresist layer pattern 214 is also decreased by a relatively small amount.

At this stage in the exemplary embodiment of a method of manufacturing the first exemplary embodiment of a display device the etching is performed without etching the insulating layer 131. Furthermore the etching is performed carefully so as not to remove the fourth photoresist layer pattern 214 and etch the underlying layers.

At this stage in the exemplary embodiment of a method of manufacturing the first exemplary embodiment of a display device the now separated patterned metal layer 195a forms the source electrode 142 and the drain electrode 143, the now separated patterned ohmic contact material layer 194a forms the ohmic contact layer 133, and the semiconductor layer 132 is completed.

Then, the fourth photoresist layer pattern 214 is removed, thereby completing the driving thin film transistor Tdr. Although not shown, a similar process may be used to form the switching thin film transistor Tsw.

Figure 3K:
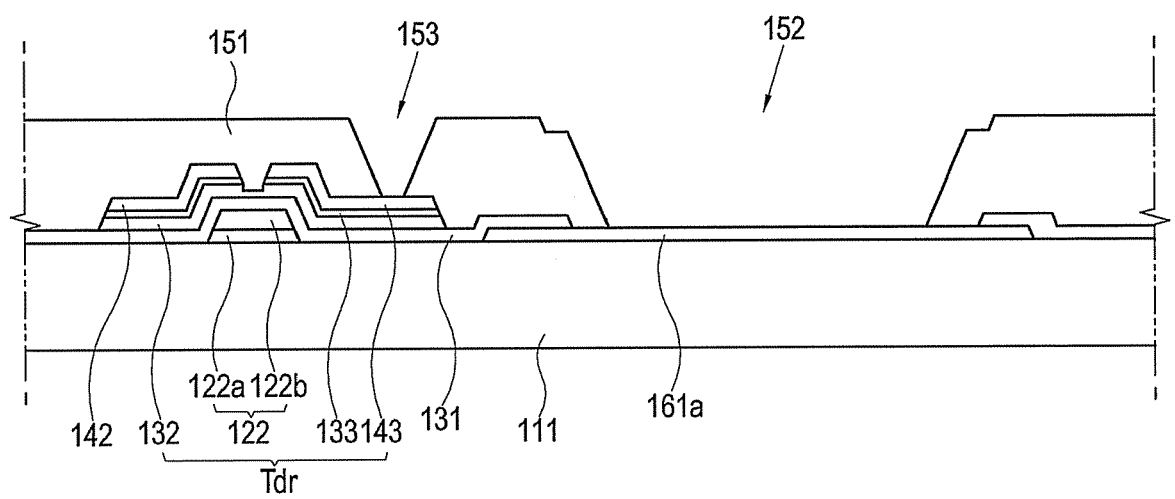

Next, the wall 151 is formed as shown in FIG. 3K. In one exemplary embodiment the wall 151 is formed by forming a photoresist layer and then exposing and developing the photoresist layer. The wall 151 is formed with the opening 152 to expose the first pixel electrode 161a and the contact hole 153 to expose the drain electrode 143.

Figure 3L:
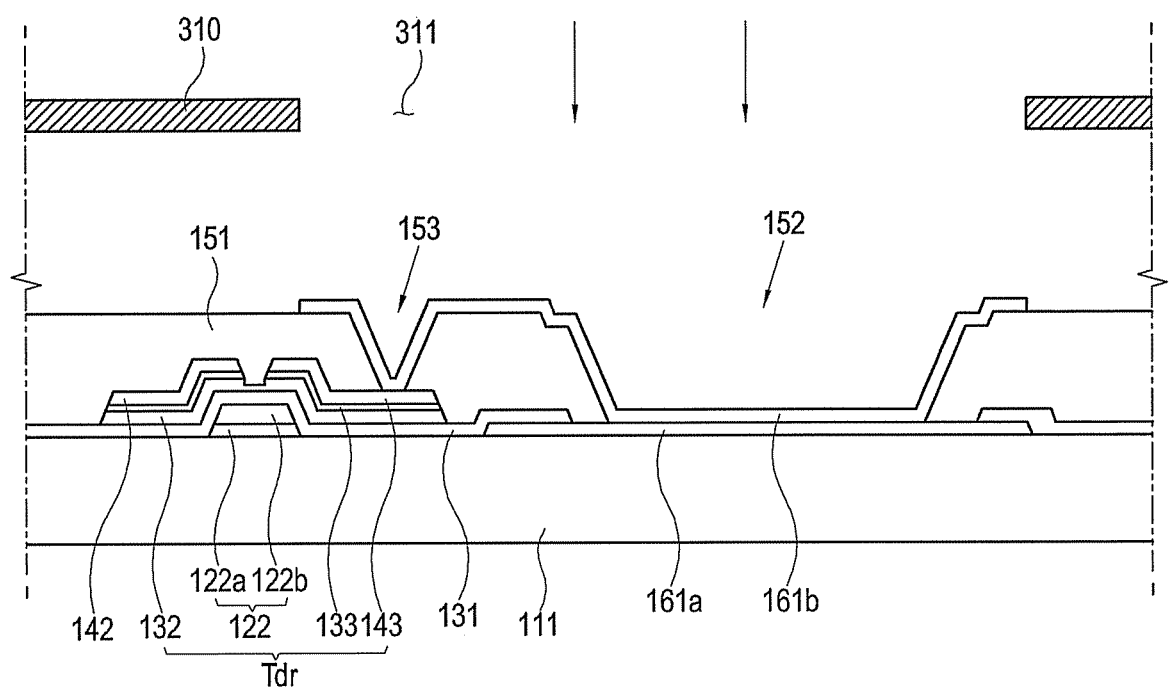

Referring to FIG. 3L, the second pixel electrode 161b is formed on the wall 151, drain electrode 143 and first pixel electrode 161a. In one exemplary embodiment the second pixel electrode 161b is formed by a sputtering or thermal evaporation method after disposing a shadow mask 310 in front of the wall 151.

The shadow mask 310 is formed with an opening 311 corresponding to a region where the second pixel electrode 161b is to be formed. Thus, the second pixel electrode 161b is formed on a region exposed through the opening 311, and the second pixel electrode 161b is not formed on a region which is substantially covered with the shadow mask 310.

Figure 3M:
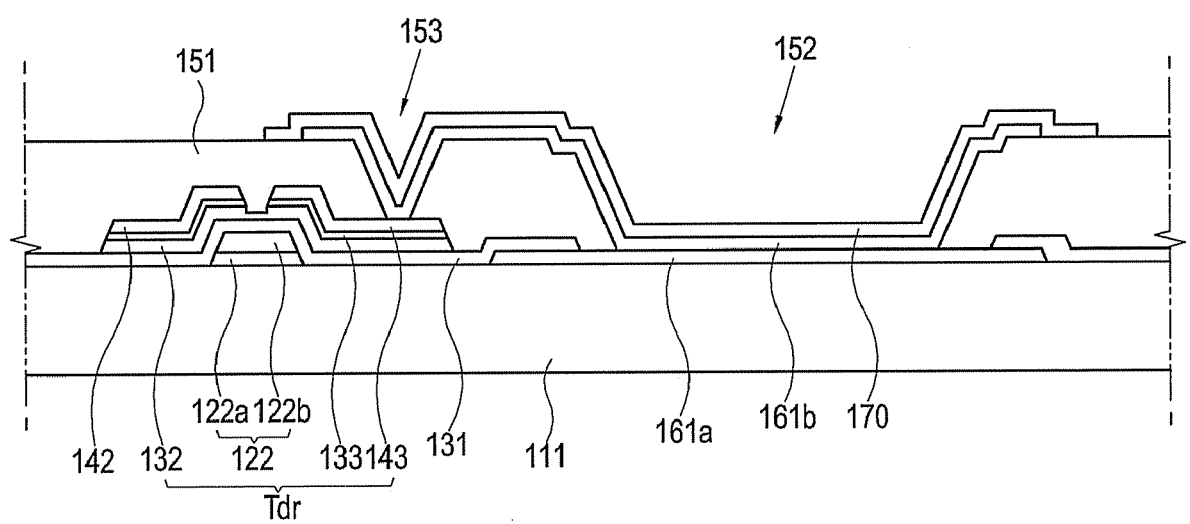
Figure 3N:
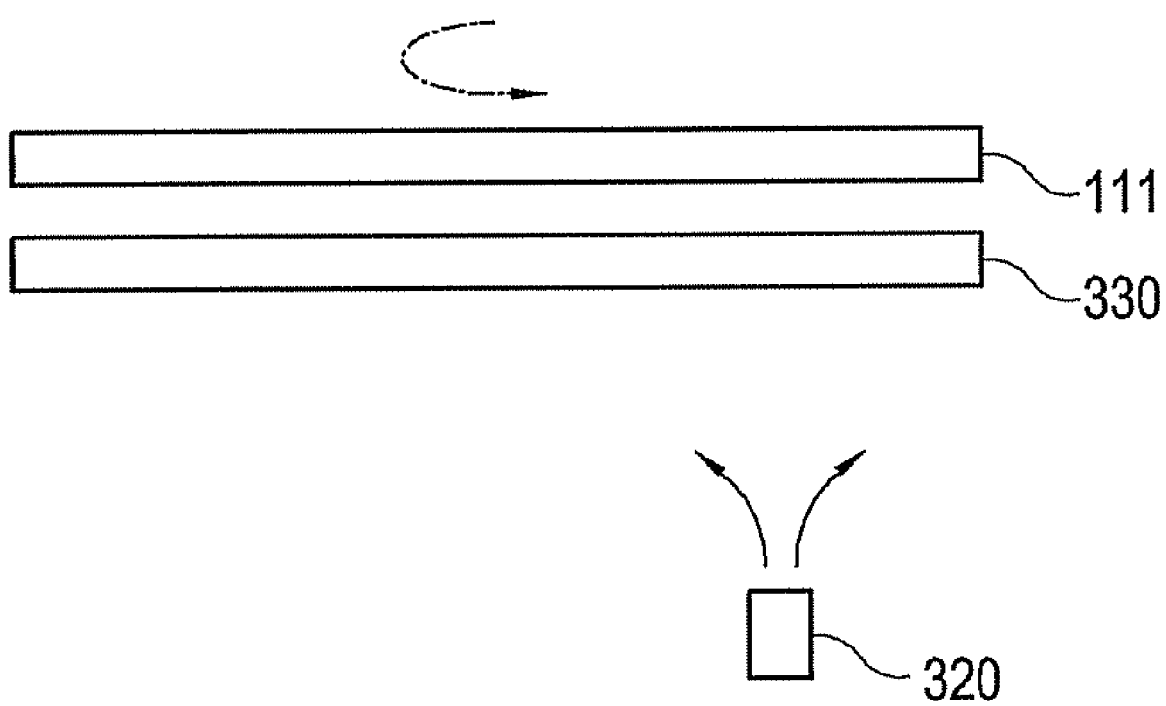

Then, referring to FIGS. 3M and 3N, an organic layer 170 is formed on the wall 151 and the second pixel electrode 161b. In the present exemplary embodiment the organic layer 170 includes a plurality of layers including an organic emission layer, which is formed by a thermal evaporation method shown in FIG. 3N. Alternative exemplary embodiments include configurations wherein the organic layer 170 is formed by other methods such as ink-jet printing.

In the thermal evaporation method, the insulating substrate 111 is disposed with the pixel electrode 161 facing downward, and an organic source 320 under the insulating substrate 110 is heated to supply organic vapor to the insulating substrate 111.

A shadow mask 330 is placed between the insulating substrate 111 and the organic source 320. The shadow mask 300 is formed with an opening (not shown), which may be larger than the second pixel electrode 161.

The organic vapor supplied from the organic source 320 is supplied to the second pixel electrode 161b and the wall 151 through the opening of the shadow mask 330. The organic vapor, which contacts either the second pixel electrode 161b or the partition wall 151, or both, decreases in temperature and is solidified into the organic layer 170.

In one exemplary embodiment the insulating substrate 111 rotates while forming the organic layer 170.

The organic layer 170 shown in the first exemplary embodiment of a display device is formed using the shadow mask. Alternative exemplary embodiments include configurations wherein an open mask is used and the organic layer 170 is formed on substantially the entire surface of the wall 151. Furthermore, alternative exemplary embodiments include configurations wherein some layers of the organic layer 170 are formed by the open mask, and other layers are formed by the shadow mask.

Then, a common electrode 180 is formed to thereby complete a first exemplary embodiment of a display device as shown in FIG. 2.

In the foregoing exemplary embodiment of a method of manufacturing a first exemplary embodiment of a display device, the photoresist layer patterns 213 and 214, which are used in forming the semiconductor layer 132, the ohmic contact layer 133, the source electrode 142 and the drain electrode 143, are provided through the use of a single mask.

According to the exemplary embodiment of a method of manufacturing a first exemplary embodiment of a display device according to the present invention, a planarization layer and a passivation layer are not employed so that a process of patterning the planarization layer and the passivation layer is not required.

Furthermore, the second pixel electrode 161b is formed through the shadow mask 310, so that there a separate patterning process for the second pixel electrode 161b is not required.

Accordingly, the present invention simplifies a method of manufacturing the exemplary embodiment of a display device.

Figure 4:
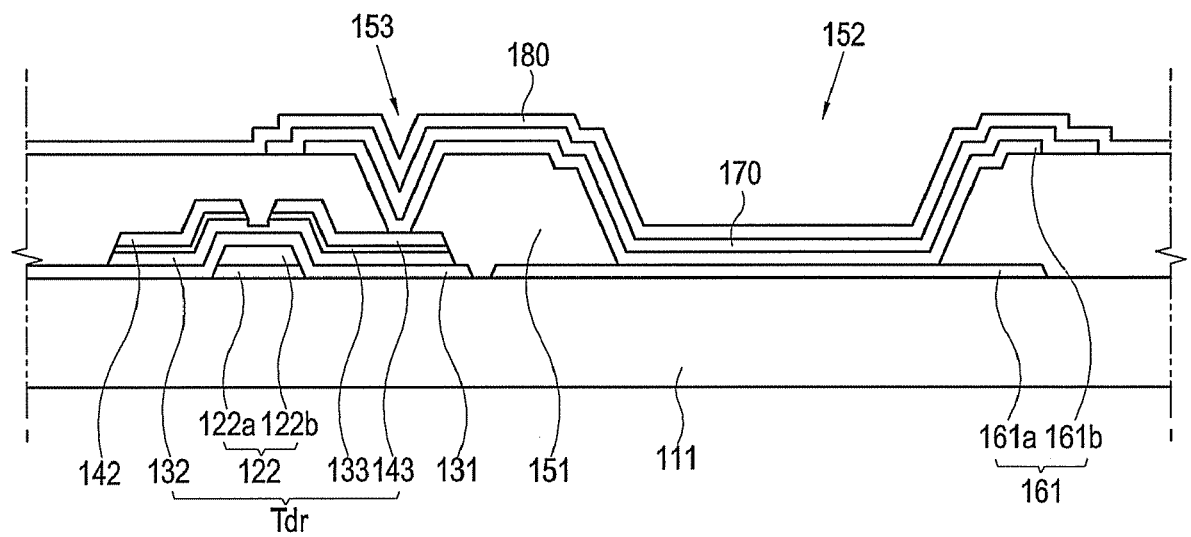
FIG. 4 is a cross-sectional view of a second exemplary embodiment of a display device according to the present invention.

A second exemplary embodiment a display device according to the present invention will be described with reference to FIG. 4.

In the second exemplary embodiment, the insulating layer 131 is spaced apart from the first pixel electrode 161a. An upper surface of the first pixel electrode 161a around the opening 152 is in contact with the wall 151.

Figure 5:
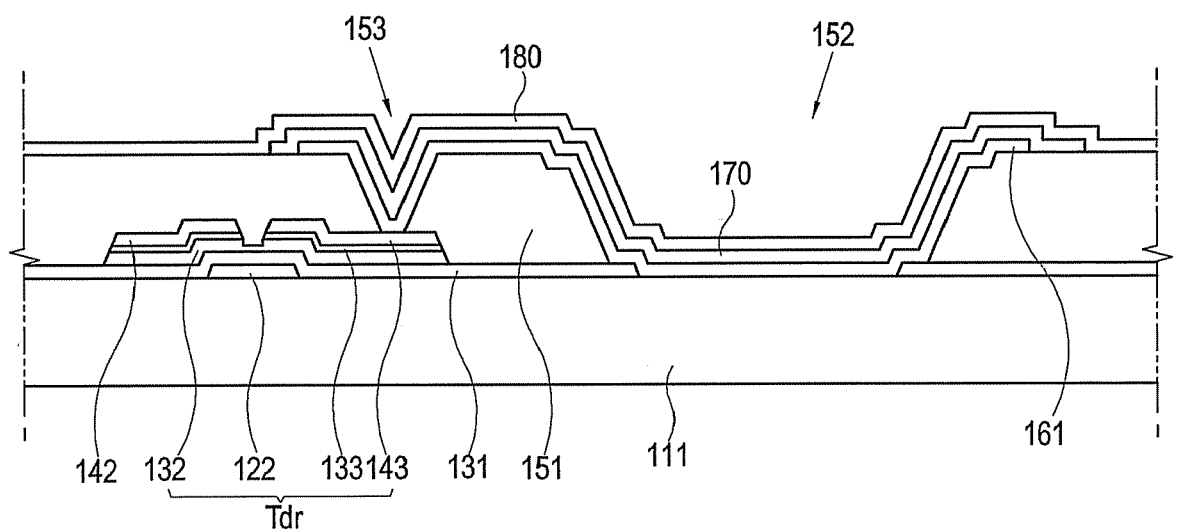
FIG. 5 is a cross-sectional view of a third exemplary embodiment of a display device according to the present invention.

A third exemplary embodiment of a display device according to the present invention will be described with reference to FIG. 5.

In the third exemplary embodiment, the pixel electrode 161 is made of a single layer. Furthermore, the pixel electrode 161 is not disposed under the insulating layer 131 or the wall 151.

Accordingly, the method of manufacturing the pixel electrode 161 can be simplified.

Figure 6:
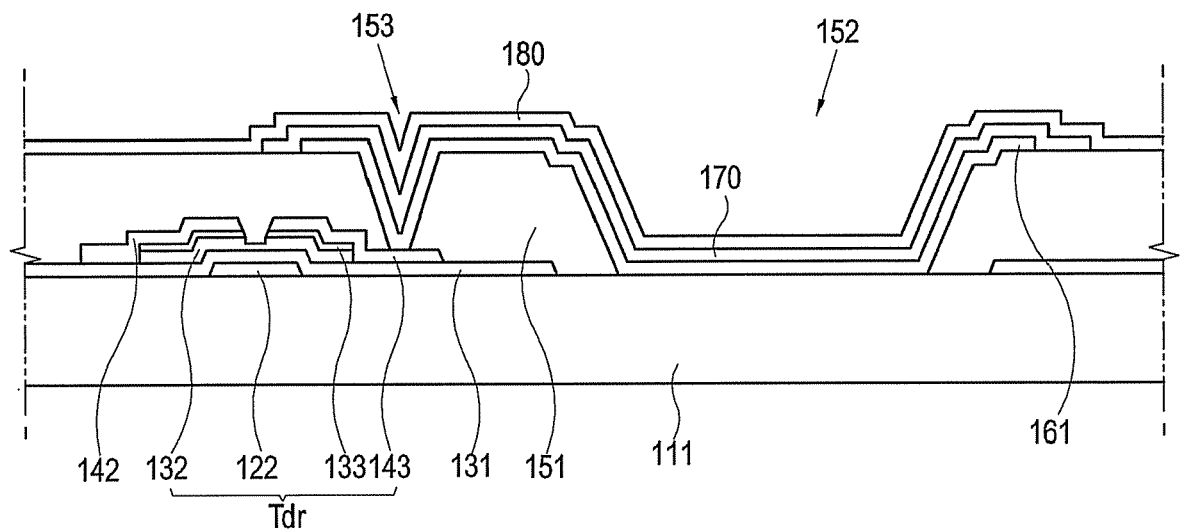
FIG. 6 is a cross-sectional view of a fourth exemplary embodiment of a display device according to the present invention.

A fourth exemplary embodiment of a display device according to the present invention will be described with reference to FIG. 6.

In the fourth exemplary embodiment, the source electrode 142 and the drain electrode 143 extend beyond the ohmic contact layer 133. In other words, the source electrode 142 and the drain electrode 143 are formed throughout a region larger than the ohmic contact layer 133.

In the fourth exemplary embodiment the source electrode 142 and the drain electrode 143 are formed by a separate photolithography step after the photolithographic forming of the ohmic contact layer 133.

In the fourth exemplary embodiment the pixel electrode 161 is provided as a single layer, and the edge of the opening 152 of the wall 151 is in direct contact with the insulating substrate 111.

Figure 7:
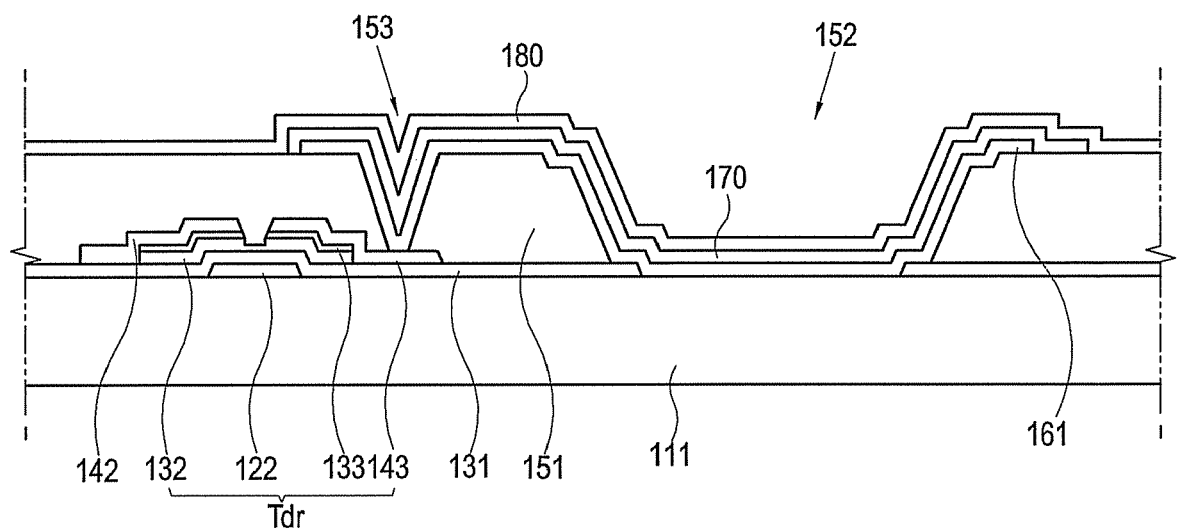
FIG. 7 is a cross-sectional view of a fifth exemplary embodiment of a display device according to the present invention.

A fifth exemplary embodiment of a display device according to the present invention will be described with reference to FIG. 7.

In the fifth exemplary embodiment, the source electrode 142 and the drain electrode 143 extend beyond the ohmic contact layer 133 as described with respect to the fourth exemplary embodiment.

The pixel electrode 161 is provided as a single layer, and the edge of the opening 152 is in direct contact with the insulating layer 131.

As described above, the present invention provides a display device having improved light emitting efficiency and a method of manufacturing the same.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display device comprising:
an insulating substrate;
a thin film transistor disposed on the insulating substrate and which comprises a drain electrode;
a wall disposed on the thin film transistor and which includes an opening and a contact hole which exposes the drain electrode;
an insulating layer disposed between the insulating substrate and the wall;
a first pixel electrode in direct contact with the insulating substrate and a second pixel electrode connected to the drain electrode through the contact hole, the second pixel electrode being disposed on the first pixel electrode;
an organic layer disposed on the second pixel electrode and which comprises an organic emission layer; and
a common electrode disposed on the organic layer,
wherein at least a portion of the first pixel electrode is disposed between the insulating substrate and the insulating layer.

2. The display device according to claim 1, wherein the thin film transistor further comprises an ohmic contact layer disposed below the drain electrode, and
the drain electrode and the ohmic contact layer have substantially the same surface area and are disposed above substantially the same region of the insulating substrate.

3. The display device according to claim 1, wherein an edge of the opening is disposed above the first pixel electrode.

4. The display device according to claim 1, wherein an edge of the opening is in direct contact with the insulating substrate.

5. The display device according to claim 1,
wherein the wall and the insulating layer are in direct contact with each other.

6. The display device according to claim 5, wherein the thin film transistor further comprises a gate electrode, and
the insulating layer is disposed between the gate electrode and the drain electrode.

7. The display device according to claim 6, wherein at least a portion of the first pixel electrode is disposed between the insulating substrate and the wall.

8. The display device according to claim 7, wherein the at least a portion of the first pixel electrode disposed between the insulating substrate and the wall has a lower resistance than the second pixel electrode.

9. The display device according to claim 6, wherein the gate electrode comprises a lower transparent layer and an upper metal layer.

10. The display device according to claim 1, wherein the common electrode comprises a reflective metal layer.

* * * * *